(12) United States Patent
Qi et al.

(10) Patent No.: US 8,975,652 B2
(45) Date of Patent: Mar. 10, 2015

(54) LED STRUCTURE, LED DEVICE AND METHODS FOR FORMING THE SAME

(75) Inventors: Jihang Qi, Shenzhen (CN); Wang Zhang, Shenzhen (CN)

(73) Assignees: Shenzhen BYD Auto R&D Company Limited (CN); BYD Company Limited (CN)

( * ) Notice: Subject to any disclaimer, the term of this patent is extended or adjusted under 35 U.S.C. 154(b) by 29 days.

(21) Appl. No.: 13/876,808

(22) PCT Filed: Sep. 21, 2011

(86) PCT No.: PCT/CN2011/079975
§ 371 (c)(1),
(2), (4) Date: Jun. 4, 2013

(87) PCT Pub. No.: WO2012/041180
PCT Pub. Date: Apr. 5, 2012

(65) Prior Publication Data
US 2013/0299861 A1    Nov. 14, 2013

(30) Foreign Application Priority Data
Sep. 30, 2010 (CN) .......................... 2010 1 0506007

(51) Int. Cl.
*H01L 33/00* (2010.01)
*H01L 33/26* (2010.01)
*H01L 33/50* (2010.01)
*H01L 33/36* (2010.01)

(52) U.S. Cl.
CPC .............. *H01L 33/26* (2013.01); *H01L 33/505* (2013.01); *H01L 33/36* (2013.01); *H01L 33/507* (2013.01); *H01L 2933/0041* (2013.01)
USPC .................................. 257/98; 257/13; 257/79

(58) Field of Classification Search
CPC ............ H01L 33/50; H01L 2933/0041; H01L 33/502; H01L 33/54
USPC .......................................... 257/13, 79, 95, 98
See application file for complete search history.

(56) References Cited

U.S. PATENT DOCUMENTS

| 8,012,774 B2 * | 9/2011 | Tran et al. ........................ 438/22 |
| 2004/0145288 A1 * | 7/2004 | Ouderkirk et al. ............. 313/110 |

(Continued)

FOREIGN PATENT DOCUMENTS

| CN | 1481032 | 3/2004 |
| CN | 100541835 C | 9/2009 |

(Continued)

OTHER PUBLICATIONS

International Search Report dated Dec. 15, 2011 for Application No. PCT/CN2011/079975.

*Primary Examiner* — Jae Lee
(74) *Attorney, Agent, or Firm* — Lerner, David, Littenberg, Krumholz & Mentlik, LLP

(57) ABSTRACT

A light emitting diode (LED) structure, a LED device and methods for forming the same are provided. The LED structure comprises a LED wafer; and a phosphor layer having a flat surface and formed above a light emitting surface of the LED wafer, in which the phosphor layer is formed by centrifugal spin coating.

17 Claims, 7 Drawing Sheets

(56) References Cited

U.S. PATENT DOCUMENTS

| | | | |
|---|---|---|---|
| 2004/0257797 A1* | 12/2004 | Suehiro et al. | 362/34 |
| 2006/0034084 A1* | 2/2006 | Matsuura et al. | 362/293 |
| 2008/0023714 A1* | 1/2008 | Chae et al. | 257/98 |
| 2009/0309114 A1 | 12/2009 | Lu et al. | |
| 2010/0295079 A1* | 11/2010 | Melman | 257/98 |
| 2011/0272706 A1 | 11/2011 | Kwak et al. | |

FOREIGN PATENT DOCUMENTS

| | | |
|---|---|---|
| CN | 101699638 A | 4/2010 |
| CN | 102044624 A | 5/2011 |
| JP | 2007059418 A | 3/2007 |
| JP | 2010087292 A | 4/2010 |
| TW | 200427110 | 12/2004 |

* cited by examiner

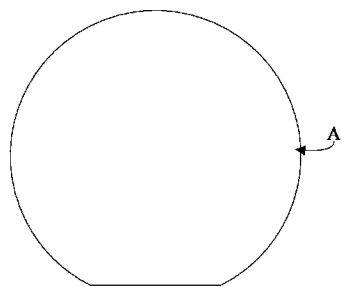
FIG. 1
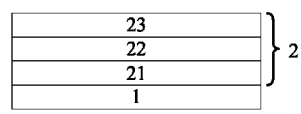
FIG. 2
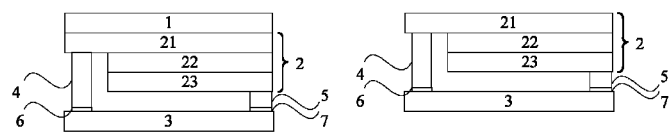
FIG. 3a  FIG. 3b
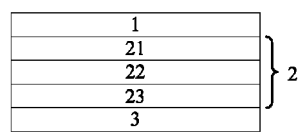 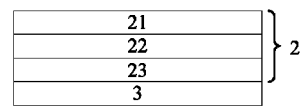
FIG. 4a  FIG. 4b

LED STRUCTURE, LED DEVICE AND METHODS FOR FORMING THE SAME

CROSS-REFERENCE TO RELATED APPLICATION

The present application is a national phase entry under 35 U.S.C. §371 of International Application No. PCT/CN2011/079975 filed Sep. 21, 2011, published in English, which claims priority from Chinese Patent Application No. 201010506007.2 filed with the State Intellectual Property Office, P.R.C. on Sep. 30, 2010, the disclosures which are incorporated herein by reference.

FIELD

The present disclosure relates to a solid semiconductor lighting field, and more particularly to an LED (light emitting diode) structure, an LED device and methods for forming the same.

BACKGROUND

Presently, a white light LED is formed by irradiating yellow fluorescent substances by a blue light. Particularly, a blue light GaN LED is sealed with a phosphor layer to form the white light LED. The sealing process comprises the following steps. A chip of the blue light GaN LED is fixed on a support of a cup structure, and then a mixture of a fluorescent substance and an adhesive is filled in the support of the cup structure with a spin coater, thus forming a phosphor layer. In this way, the phosphor layer may not have a flat surface, thus causing problems like light spots and light inconsistency. With higher and higher requirements on light consistency and color rendition in the application of LED TVs and LED headlights of automobiles, the sealing problems may need to be solved.

SUMMARY

The present disclosure is directed to solve at least one of the problems existing in the prior art. Accordingly, an LED structure and a method for forming the same may need to be provided. Further, an LED device comprising the LED structure and a method for forming the same may also need to be provided.

According to an aspect of the present disclosure, an LED structure may be provided. The LED structure may comprise an LED wafer; and a phosphor layer having a flat surface and formed above a light emitting surface of the LED wafer, in which the phosphor layer may be formed by centrifugal spin coating.

According to another aspect of the present disclosure, a method for forming an LED structure may be provided. The method may comprise steps of: providing an LED wafer; forming a mixture of a fluorescent substance and an adhesive above a light emitting surface of the LED wafer by centrifugal spin coating; and curing the mixture of the fluorescent substance and the adhesive to form a phosphor layer having a flat surface.

According to a further aspect of the present disclosure, an LED device may be provided. The LED device may comprise a substrate; an LED epitaxial layer comprising a first semiconductor layer, an active layer and a second semiconductor layer formed sequentially on the substrate; a first electrode electrically connected to the first semiconductor layer; a second electrode electrically connected to the second semiconductor layer; and a phosphor layer having a flat surface formed above the LED epitaxial layer, in which the phosphor layer may be formed by centrifugal spin coating.

According to a still further aspect of the present disclosure, a method for forming an LED device may be provided. The method may comprise steps of: providing an LED wafer; forming a phosphor layer having a flat surface above a light emitting surface of the LED wafer by the aforementioned method; photo-etching a surface of the LED wafer to expose an electrode area; depositing an electrode in the electrode area; and disputing the LED wafer to form a plurality of LED devices.

According to an embodiment of the present disclosure, a phosphor layer may be formed by a centrifugal spinning coating method so that the phosphor layer may have a flat surface, thus simplifying the subsequent steps in the LED packaging process.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the present disclosure will become apparent and more readily appreciated from the following descriptions taken in conjunction with the drawings in which:

FIG. 1 is a top view of an LED wafer according to an embodiment of the present disclosure;

FIG. 2 is a cross-sectional view of a portion of an LED wafer according to an embodiment of the present disclosure;

FIGS. 3a, 3b, 4a, and 4b are cross-sectional views of a portion of a flip LED wafer according to an embodiment of the present disclosure;

DETAILED DESCRIPTION

Figure 5A:
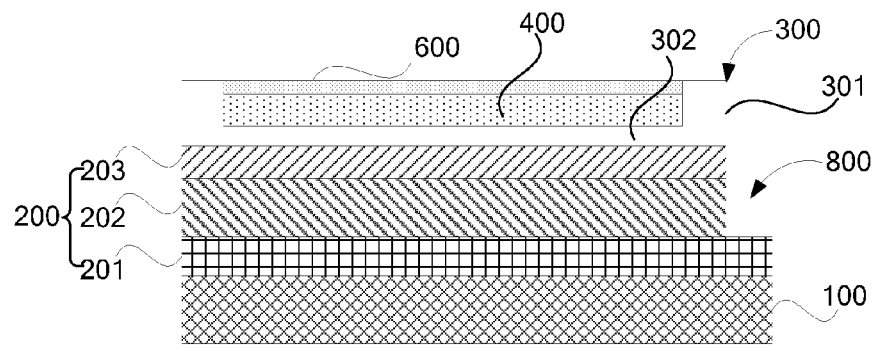
FIGS. 5a, 5b, and 5c are cross-sectional views of a portion of a face-up LED wafer with a phosphor layer according to an embodiment of the present disclosure.

Reference will be made in detail to embodiments of the present disclosure. The embodiments described herein are explanatory, illustrative, and used to generally understand the present disclosure. The embodiments shall not be construed to limit the present disclosure. The same or similar elements and the elements having same or similar functions are denoted by like reference numerals throughout the descriptions.

According to an embodiment of the present disclosure, a phosphor layer may be formed by centrifugal spin coating so that the phosphor layer may have a flat surface, thus simplifying the subsequent steps in the LED packaging process.

It should be noted that, the LED structure according to an embodiment of the present disclosure may be an LED wafer formed with a phosphor layer which may be capable of emitting white light, and the method for forming the LED structure according to an embodiment of the present disclosure may be a method of forming a phosphor layer on the LED wafer. The LED wafer described in the present disclosure may be an integral wafer without subjecting to a disparting step, for example, an LED wafer A shown in FIG. 1. The LED wafer A may be an initial wafer or a treated wafer.

The LED wafer A may be any one known in the art, and there are no special limits on the wavelength of lights emitted from the LED wafer A. The mixture of a fluorescent substance and an adhesive may be known in the art, and there are no special limits on the wavelength of lights stimulated from the phosphor layer which may be formed by curing the mixture of the fluorescent substance and the adhesive, provided that the phosphor layer and the LED wafer A can be used together with each other.

The initial wafer may be a conventional one known to those skilled in the art, and can be fabricated by a conventional method known in the art, such as a metal organic chemical vapor deposition (MOCVD) technology or a molecular beam epitaxy (MBE) technology. As shown in FIG. 2, the initial wafer may comprise a first substrate 1 and an LED epitaxial layer 2 formed on the first substrate 1. The LED epitaxial layer 2 may comprise a first semiconductor layer 21 formed on the first substrate 1, an active layer 22 formed on the first semiconductor layer 21, and a second semiconductor layer 23 formed on the active layer 22. In some embodiments, the first semiconductor layer 21 may be an N-type semiconductor layer, and the second semiconductor layer 23 may be a P-type semiconductor layer to form a PN junction. In other embodiments, the first semiconductor layer 21 may be a P-type semiconductor layer, and the second semiconductor layer 23 may be an N-type semiconductor layer to form a PN junction. In some embodiments, the active layer 22 may be a quantum well layer, particularly, a multiple quantum well layer. In an embodiment, the first semiconductor layer 21 may be an N-type gallium nitride (GaN) semiconductor layer, the second semiconductor layer 23 may be a P-type GaN semiconductor layer, and the active layer 22 may be a gallium indium nitride (InGaN) multiple quantum well layer.

In an embodiment, the first substrate 1 may be a non-conducting substrate such as a sapphire substrate. The initial wafer comprising the non-conducting substrate may be defined as a horizontal face-up LED wafer.

In another embodiment, the first substrate 1 may be a conducting substrate such as a silicon substrate or a silicon carbide (SiC) substrate. The initial wafer comprising the conducting substrate may be defined as a vertical face-up LED wafer.

The treated wafer may be obtained by treating the initial wafer. The treated wafer may be a horizontal flip LED wafer or a vertical flip LED wafer.

In some embodiments, the horizontal flip LED wafer may be fabricated by the following steps: dividing the horizontal face-up LED wafer into a plurality of LED units; forming electrodes on the same side of the LED unit; and forming the horizontal flip LED wafer on a second substrate with the second semiconductor layer formed on the second substrate. As shown in FIG. 3a, a cross-sectional view of a portion of the horizontal flip LED wafer (i.e., an LED unit) is shown. The horizontal flip LED wafer may comprise a first substrate 1; an LED epitaxial layer 2 comprising a first semiconductor layer 21 connected to the first substrate 1, a second semiconductor layer 23, and an active layer 22 between the first and second semiconductor layers 21, 23; a first electrode 4 connected to the first semiconductor layer 21; a second electrode 5 connected to the second semiconductor layer 23; a second substrate (i.e., a supporting substrate) 3; and a first electrode pad 6 and a second electrode pad 7 formed on the second substrate 3 and connected with the first electrode 4 and the second electrode 5 respectively to form an electrical connection between the LED epitaxial layer 2 and the second substrate 3.

In an embodiment, the first substrate 1 may be removed in the subsequent steps. The removal of the first substrate 1 may be performed by any method known in the art, such as one selected from the group consisting of: grinding, etching, laser irradiation, or any combination thereof. FIG. 3b shows a horizontal flip LED wafer without the first substrate 1 shown in FIG. 3a.

In an embodiment, a face-up LED wafer may be formed on a second substrate to form a flip LED wafer. As shown in FIG. 4a, a vertical flip LED wafer is shown. The vertical flip LED wafer may comprise a first substrate 1; an LED epitaxial layer 2 comprising a first semiconductor layer 21 connected with the first substrate 1, a second semiconductor layer 23, and an active layer 22 between the first and second semiconductor layers 21, 23; and a second substrate (i.e., a supporting substrate) 3 connected to the second semiconductor layer 23.

In an embodiment, the first substrate 1 may be removed in the subsequent steps. The removal of the first substrate 1 may be performed by any method known in the art, such as one selected from the group consisting of: grinding, etching, laser irradiation, or any combination thereof. FIG. 4b shows a vertical flip LED wafer without the first substrate 1 shown in FIG. 4a.

In an embodiment, the first semiconductor layer 21 may be an N-type GaN semiconductor layer, the second semiconductor layer 23 may be a P-type GaN semiconductor layer, and the active layer 22 may be an InGaN multiple quantum well layer.

In the following embodiments, a GaN-based blue LED wafer formed with a phosphor layer may emit white light.

In an embodiment, the phosphor layer may comprise a cured mixture of a fluorescent substance and an adhesive. In an embodiment, the adhesive may be epoxy resin or silica gel. In an embodiment, the fluorescent substance may be an yttrium aluminum garnet (YAG) phosphor activated by rare earth metals.

According to an embodiment of the present disclosure, an LED device may comprise the LED structure described above. In some embodiments, the LED device may be a horizontal face-up LED device, a horizontal flip LED device, a vertical face-up LED device, or a vertical flip LED device.

Embodiment 1

Example a)

As shown in FIG. 5a, a cross-sectional view of a portion of a horizontal face-up LED wafer 800 is shown. The horizontal face-up LED wafer 800 comprises a sapphire substrate 100; and an LED epitaxial layer 200 comprising an N-type GaN semiconductor layer 201 formed on the sapphire substrate 100, a P-type GaN semiconductor layer 203, and an InGaN multiple quantum well layer 202 between the P-type and N-type GaN semiconductor layers 201, 203. Preferably, the InGaN multiple quantum well layer 202 and the P-type GaN semiconductor layer 203 are etched to expose a portion of the N-type GaN semiconductor layer 201, thus forming a step structure between the P-type GaN semiconductor layer 203 and the N-type GaN semiconductor layer 201, as shown in FIG. 5a. The top surface of the etched P-type GaN semiconductor layer 203 is the light emitting surface of the horizontal face-up LED wafer 800.

In some embodiments, the LED structure formed with a phosphor layer comprises a horizontal face-up LED wafer 800; a transparent accommodating layer 300 with a recess formed on a light emitting surface of the horizontal face-up LED wafer 800; a phosphor layer 400 with a flat surface formed in the recess of the transparent accommodating layer 300; and a protective layer 600 formed on the phosphor layer 400 and sealing the phosphor layer 400 in the recess of the transparent accommodating layer 300. The phosphor layer 400 is formed by centrifugal spin coating. In some embodiments, as shown in FIG. 5a, the horizontal face-up LED wafer 800 only comprises one LED unit. In other embodiments, the horizontal face-up LED wafer 800 comprises a plurality of LED units; each LED unit has a step structure; and a transparent accommodating layer, a phosphor layer and a protective layer are formed on each LED unit sequentially.

In some embodiments, the transparent accommodating layer 300 may be a layer of a visibly transparent material such as silicon dioxide. In other embodiments, the transparent accommodating layer 300 may be a layer of a material selected from the group consisting of: indium tin oxides, aluminum zinc oxides, indium zinc oxides, and combinations thereof. There are no special limits on the transparent accommodating layer 300, provided that the transparent accommodating layer 300 favors the transmittance of visible light and an effective electrical connection between the transparent accommodating layer 300 and the P-type GaN semiconductor layer 203 is formed.

The transparent accommodating layer 300 comprises a bottom 302 and a side wall 301 surrounding the bottom 302 and extending upwards from the bottom 302. The bottom 302 and the side wall 301 define a recess. Optionally, larger area of the P-type GaN semiconductor layer 203 covered by the transparent accommodating layer 300, or larger area of the bottom 302 may favor the subsequent steps. In one embodiment, the thickness of the phosphor layer 400 may be smaller than the height of the side wall 301. In this way, the thickness of the phosphor layer 400 may be adjusted by controlling the height of the side wall 301, thus solving the problem of the uncontrollable thickness of the phosphor layer in the prior art. Therefore, the transparent accommodating layer 300 may adjust the shape and the thickness of the phosphor layer 400, thus further solving problems such as light inconsistency and light spots and improving the optical performance of the LED device comprising the LED wafer.

In one embodiment, a middle portion of the bottom 302 of the transparent accommodating layer 300 is convex, that is, the bottom 302 of the transparent accommodating layer 300 comprises a first bottom portion, a second bottom portion and a middle bottom portion between the first and second bottom portions. In one embodiment, the depth of the first bottom portion to the top surface of the recess equals to that of the second bottom portion to the top surface of the recess, and the depth of the first bottom portion to the top surface of the recess is no less than that of the middle bottom portion to the top surface of the recess. Thus, low color purities of lights due to different optical paths of emitted lights in different directions in the phosphor layer can be alleviated. With the transparent accommodating layer 300, lights emitted from each point of the light emitting surface of the LED wafer may have the same optical path in the phosphor layer, thus improving the consistency of main wavelengths of lights emitted from each point of the light emitting surface of the LED wafer and improving the color purity of the LED chip comprising the LED wafer. Optionally, the transparent accommodating layer may have a side wall but no bottom. And further, the transparent accommodating layer can be omitted, and the phosphor layer 400 can be directly formed on the light emitting surface of the horizontal face-up LED wafer 800. In this way, the thickness of the phosphor layer may be adjusted by controlling the amount of the mixture of the fluorescent substance and the adhesive.

In one embodiment, the protective layer 600 may be a silicon dioxide layer or a layer of a transparent metal oxide, preferably, a silicon dioxide layer. The transparent metal oxide may be, for example, an indium tin oxide, an aluminum zinc oxide, an indium zinc oxide, or combinations thereof. The area of the surface of the protective layer 600 is equal to or greater than the area of the top surface of the recess in the transparent accommodating layer 300, in order to form a closed space between the protective layer 600 and the transparent accommodating layer 300. The phosphor layer 400 may be sealed in the closed space, thus preventing outside organic solvents, plasma and other materials from reacting with the fluorescent substance in subsequent steps and reducing the thickness and the life of the phosphor layer 400. Preferably, the protective layer 600 may connect directly with the phosphor layer 400, to reduce the total emission of the emitted light and increase the light emitting efficiency. Optionally, in some embodiments, the protective layer 600 may be omitted.

Example b)

Figure 5B:
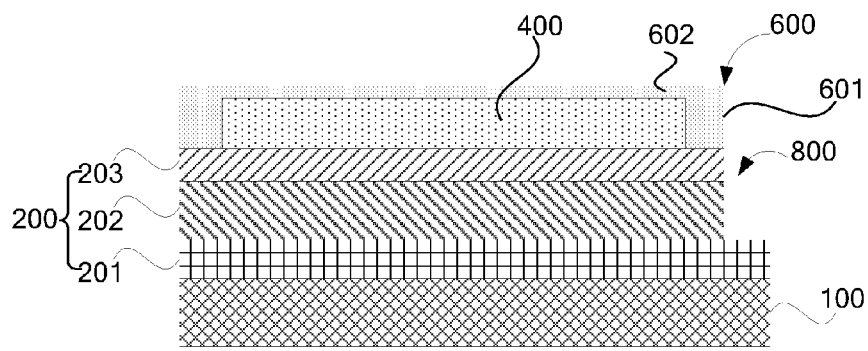

The horizontal face-up LED wafer 800 in FIG. 5b is the same as that shown in FIG. 5a, so a detailed description thereof is omitted here for brevity.

As shown in FIG. 5b, the LED structure formed with a phosphor layer comprises a horizontal face-up LED wafer 800; a phosphor layer 400 with a flat surface formed on a light emitting surface of the horizontal face-up LED wafer 800; and a protective layer 600 formed on the phosphor layer 400. The protective layer 600 and the horizontal face-up LED wafer 800 form a recess therebetween to seal the phosphor layer 400 in the recess. The phosphor layer 400 is formed by centrifugal spin coating.

In one embodiment, the protective layer 600 may be a silicon dioxide layer or a layer of a transparent metal oxide, preferably, a silicon dioxide layer. The transparent metal oxide may be, for example, an indium tin oxide, an aluminum zinc oxide, an indium zinc oxide, or combinations thereof.

The protective layer 600 comprises a top 602 and a side wall 601 surrounding the top 602 and extending from the top 602 to the horizontal face-up LED wafer 800. The top 602 and the side wall 601 define a recess in the protective layer 600. Preferably, larger area of the top 602 may favor the subsequent steps. The protective layer 600 has an inverted U shape and is formed on the P-type GaN semiconductor layer 203, to seal the phosphor layer 400 in the closed recess between the horizontal face-up LED wafer 800 and the protective layer 600. The thickness of the phosphor layer 400 may be controlled by adjusting the amount of the mixture of the fluorescent substance and the adhesive. Preferably, the horizontal face-up LED wafer 800 and the protective layer 600 form a closed recess, which is filled with the phosphor layer 400. In this way, the light emitting efficiency may be improved. Similarly, in some embodiments, the protective layer 600 can be omitted.

The protective layer 600 may be a transparent conductive layer.

Example c)

Figure 5C:
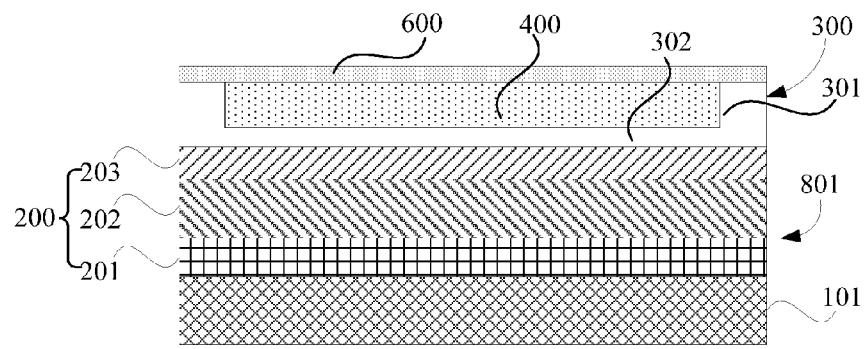

As shown in FIG. 5c, the vertical face-up LED wafer 801 is substantially the same as that described in Example a) in EMBODIMENT 1, with the following exceptions.

The first substrate 101 is a conductive substrate such as a SiC substrate or a silicon substrate.

The first substrate 101 is conductive, and thus the step of removing a portion of the P-type semiconductor layer and a portion of the active layer to expose a portion of the N-type semiconductor layer is avoided.

As shown in FIG. 5c, in some embodiments, the LED structure formed with a phosphor layer comprises a vertical face-up LED wafer 801; a transparent accommodating layer 300 with a recess formed on a light emitting surface of the vertical face-up LED wafer 801; a phosphor layer 400 with a flat surface formed in the recess of the transparent accommodating layer 300; and a protective layer 600 formed on the phosphor layer 400. The protective layer 600 and the transparent accommodating layer 300 seal the phosphor layer 400 in the recess. The phosphor layer 400 is formed by centrifugal spin coating. The light emitting surface of the vertical face-up LED wafer 801 may be a top surface of the P-type GaN semiconductor layer 203. In some embodiments, as shown in FIG. 5c, the vertical face-up LED wafer 801 only comprises one LED unit. In other embodiments, it should be construed that the vertical face-up LED wafer 801 comprises a plurality of LED units; and a transparent accommodating layer, a phosphor layer and a protective layer are formed on each LED unit sequentially.

There are no special limits on the transparent accommodating layer 300, provided that the transparent accommodating layer 300 favors the transmittance of visible light and an effective electrical connection between the transparent accommodating layer 300 and the P-type GaN semiconductor layer 203 is formed. The transparent accommodating layer 300 comprises a bottom 302 and a side wall 301 formed on a periphery of the bottom 302. The side wall 301 extends from the bottom 302 to the protective layer 600, and the side wall 301 and the bottom 302 define a recess therebetween. In one embodiment, the thickness of the phosphor layer 400 may be the same as the height of the side wall 301.

In this way, the thickness of the phosphor layer 400 may be adjusted by controlling the height of the side wall 301, thus solving the problem of the uncontrollable thickness of the phosphor layer 400 in the prior art. Therefore, the transparent accommodating layer 300 may adjust the shape and the thickness of the phosphor layer 400, thus further solving problems such as light inconsistency and light spots and improving the optical performance of the LED device comprising the LED wafer.

In one embodiment, the transparent accommodating layer 300 may cover the entire light emitting surface of the vertical face-up LED wafer 801. In another embodiment, the transparent accommodating layer 300 may cover a part of the light emitting surface of the vertical face-up LED wafer 801, and an electrode may be deposited on the remaining part of the light emitting surface of the vertical face-up LED wafer 801 in the subsequent steps.

In one embodiment, the protective layer 600 may be a silicon dioxide layer or a layer of a transparent metal oxide, preferably, a silicon dioxide layer. The transparent metal oxide may be, for example, an indium tin oxide, an aluminum zinc oxide, an indium zinc oxide, or combinations thereof. The area of the surface of the protective layer 600 is greater than the area of the top surface of the recess in the transparent accommodating layer 300, in order to form a closed space between the protective layer 600 and the transparent accommodating layer 300. The phosphor layer 400 may be sealed in the closed space, thus preventing outside organic solvents, plasma and other materials from reacting with the fluorescent substance in subsequent steps and reducing the thickness and the life of the phosphor layer 400.

With the LED structure according to an embodiment of the present disclosure, in the method for forming the LED structure in EMBODIMENT 1, the step of dispensing the mixture of the fluorescence and the adhesive may be avoided in comparison with the method for forming the LED structure in the prior art, thus simplifying the packaging process and improving the packaging efficiency.

Embodiment 2

Example d)

In the following, a horizontal face-up LED device is provided.

Figure 6A:
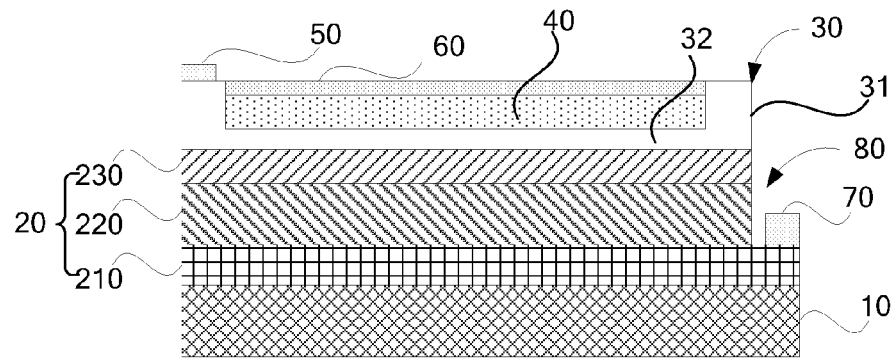
FIGS. 6a, 6b, and 6c are cross-sectional views of an LED device according to an embodiment of the present disclosure.

As shown in FIG. 6a, an LED device is formed by depositing electrodes on an LED unit in an LED structure shown in FIG. 5a.

The LED device comprises a sapphire substrate 10, an LED epitaxial layer 20, a transparent accommodating layer 30, a phosphor layer 40 with a flat surface, a second electrode 50, a protective layer 60, and a first electrode 70. In this embodiment, the sapphire substrate 10 is used as a supporting substrate. In some embodiments, the phosphor layer 40 is formed by centrifugal spin coating.

The LED epitaxial layer 20 is formed on the substrate 10, and comprises an N-type GaN semiconductor layer 210 formed on the substrate 10, an InGaN multiple quantum well layer 220 formed on the N-type GaN semiconductor layer 210, and a P-type GaN semiconductor layer 230 formed on the InGaN multiple quantum well layer 220. The light emitting surface of the LED epitaxial layer 20 (i.e., the light emitting surface of an LED unit 80 in a horizontal face-up LED wafer) is the top surface of the P-type GaN semiconductor layer 230. A portion of the P-type GaN semiconductor layer 230 and a portion of the active layer 220 are removed to expose a portion of the N-type GaN semiconductor layer 210 and form a step structure between the P-type GaN semiconductor layer 230 and the N-type GaN semiconductor layer 210. The first electrode 70 may be formed on the exposed portion of the N-type GaN semiconductor layer 210, thus forming an electrical connection between the first electrode 70 and the N-type GaN semiconductor layer 210.

The transparent accommodating layer 30 comprises a bottom 32 and a side wall 31 surrounding the bottom 32 and extending upwards from the bottom 32, and is formed with a recess between the side wall 31 and the bottom 32. The phosphor layer 40 is formed in the recess. In this way, the transparent accommodating layer 30 may adjust the shape and the thickness of the phosphor layer 40, thus further solving problems such as light inconsistency and light spots and improving the optical performance of the LED device. In one embodiment, a middle portion of the bottom 32 of the transparent accommodating layer 30 is convex, for example, the bottom 32 of the transparent accommodating layer 30 comprises a first bottom portion, a second bottom portion and a middle bottom portion between the first and second bottom portions. In one embodiment, the depth of the first bottom portion to the top surface of the recess equals to that of the second bottom portion to the top surface of the recess, and the depth of the first bottom portion to the top surface of the recess is no less than that of the middle bottom portion to the top surface of the recess. Thus, low color purities due to different optical paths of emitted lights in different directions in the phosphor layer can be alleviated. With the transparent accommodating layer 30, lights emitted from each point of the light emitting surface of the LED wafer may have the same optical path in the phosphor layer, thus improving the consistency of main wavelengths of lights emitted from each point of the light emitting surface of the LED wafer and improving the color purity of the LED chip comprising the LED wafer. Optionally, the transparent accommodating layer may have a side wall but no bottom. And further, the transparent accommodating layer can be omitted, and the phosphor layer 40 can be directly formed on the light emitting surface of the LED unit 80.

In one embodiment, if a good electrical connection between the transparent accommodating layer 30 and the P-type GaN semiconductor layer 230 is formed, the second electrode 50 is formed on the side wall 31 of the transparent accommodating layer 30, thus forming an electrical connection between the second electrode 50 and the P-type GaN semiconductor layer 230. In another embodiment, if a good electrical connection between the transparent accommodating layer 30 and the P-type GaN semiconductor layer 230 is not formed, an opening is formed in the side wall 31 of the transparent accommodating layer 30 and passes through the bottom 32 of the transparent accommodating layer 30 to expose a portion of the P-type GaN semiconductor layer 230, and then the second electrode 50 is deposited in the opening and directly formed on the P-type GaN semiconductor layer 230. In this way, an electrical connection between the second electrode 50 and the P-type GaN semiconductor layer 230 can be achieved. In a further embodiment, the top surface of the P-type GaN semiconductor layer 230 (i.e., the light emitting surface of the LED unit 80) can be divided into an electrode area and a transparent accommodating layer area, and then the transparent accommodating layer 30 is formed on the transparent accommodating layer area and the second electrode 50 is deposited on the electrode area.

The protective layer 60 may be a silicon dioxide layer or a layer of a transparent metal oxide, preferably, a silicon dioxide layer. In one embodiment, the transparent metal oxide may be, for example, an indium tin oxide, an aluminum zinc oxide, an indium zinc oxide, or combinations thereof. The area of the surface of the protective layer 60 is equal to or greater than the area of the top surface of the recess in the transparent accommodating layer 30, in order to form a closed space between the protective layer 60 and the transparent accommodating layer 30. The phosphor layer 40 is closed in the closed space, thus preventing the phosphor layer 40 from reacting with other outside materials. Optionally, the protective layer 60 is directly connected with the phosphor layer 40 and filled in the recess to enhance the light emitting efficiency. In one embodiment, the protective layer 60 can be omitted.

Example e)

In the following, a horizontal face-up LED device is provided.

Figure 6B:
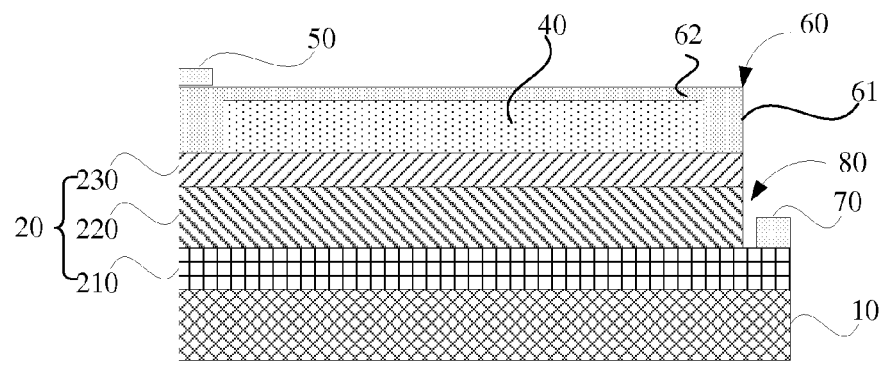

As shown in FIG. 6b, an LED device is formed by depositing electrodes on an LED unit in an LED structure shown in FIG. 5b.

The LED device comprises a sapphire substrate 10, an LED epitaxial layer 20, a phosphor layer 40 with a flat surface, a second electrode 50, a protective layer 60, and a first electrode 70. In some embodiments, the phosphor layer 40 is formed by centrifugal spin coating.

In this embodiment, the sapphire substrate 10 is used as a supporting substrate. The structure and the connection relations of the LED epitaxial layer 20 and the first electrode 70 are the same as those described in Example d) in EMBODIMENT 1.

The protective layer 60 may be a silicon dioxide layer or a transparent metal oxide layer. The protective layer 60 is transparent and has an inverted U-shape. As shown in FIG. 6b, the protective layer 60 comprises a top 62 and a side wall 61. The side wall 61 is formed on the top 62 and extends from the top 62 to the LED epitaxial layer 20. The protective layer 60 is formed on the P-type GaN semiconductor layer 230, and the bottom surface of the side wall 61 is connected with the light emitting surface of the LED epitaxial layer 20. In this way, a recess is formed between the LED epitaxial layer 20 and the protective layer 60, and the phosphor layer 40 is formed on the light emitting surface of the LED epitaxial layer 20 and filled and closed in the recess between the LED epitaxial layer 20 and the protective layer 60. In one embodiment, the phosphor layer 40 is fully filled in the recess, thus improving the light emitting efficiency. Optionally, in some embodiments, the protective layer 60 can be omitted.

In one embodiment, if a good electrical connection between the protective layer 60 and the P-type GaN semiconductor layer 230 is formed, the second electrode 50 is directly formed on the top 61 of the protective layer 60, thus forming an electrical connection between the second electrode 50 and the P-type GaN semiconductor layer 230.

In another embodiment, if a good electrical connection between the protective layer 60 and the P-type GaN semiconductor layer 230 is not formed, an opening may be formed in the top 62 of the protective layer 50 and passes through the side wall 61 of the protective layer 60 to expose a portion of the P-type GaN semiconductor layer 230, and then the second electrode 50 is deposited in the opening and directly formed on the P-type GaN semiconductor layer 230. In this way, an electrical connection between the second electrode 50 and the P-type GaN semiconductor layer 230 can be achieved.

In a further embodiment, the top surface of the P-type GaN semiconductor layer 230 (i.e., the light emitting surface of the LED unit 80) is divided into an electrode area and a protective layer area, and then the protective layer 60 is formed on the protective layer area and the second electrode 50 is deposited on the electrode area.

Example f)

In the following, a vertical flip LED device is provided.

Figure 6C:
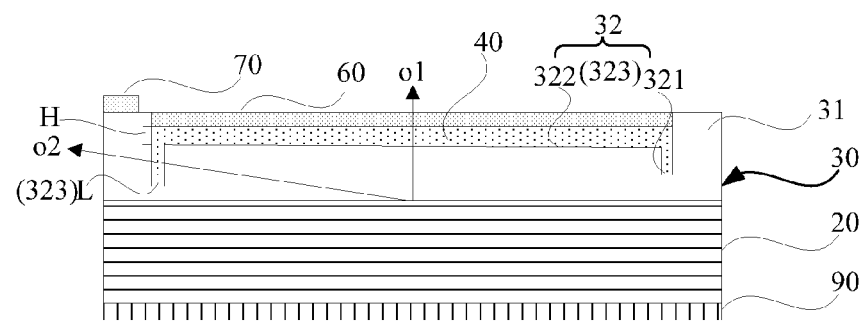

As shown in FIG. 6c, an LED device is formed by depositing electrodes on an LED unit in an LED structure shown in FIG. 5c.

The LED device comprises a second substrate 90, an LED epitaxial layer 20, a transparent accommodating layer 30, a phosphor layer 40 with a flat surface, a protective layer 60, and a first electrode 70.

In this embodiment, the second substrate 90 is used as a supporting substrate. In some embodiments, the phosphor layer 40 is formed by centrifugal spin coating.

The LED epitaxial layer 20 comprises a P-type GaN semiconductor layer electrically connected with the second substrate 90, an N-type GaN semiconductor layer, and an InGaN multiple quantum well layer between the N-type and P-type GaN semiconductor layers. The light emitting surface of the LED epitaxial layer 20 (i.e., the light emitting surface of the LED device) is the top surface of the N-type GaN semiconductor layer.

The transparent accommodating layer 30 is formed on the N-type GaN semiconductor layer and comprises a bottom 32 and a side wall 31. The side wall 31 is formed on a periphery of the bottom 32 and extends from the bottom 31 to the protective layer 60. In this way, the bottom 32, the side wall 31 and the protective layer 60 define a closed recess therebetween. Optionally, the recess may have a shape of a hexahedron. The phosphor layer 40 is filled in the recess. Therefore, the shape and the thickness of the phosphor layer 40 can be adjusted by controlling the side wall 31 of the transparent accommodating layer 30, thus further solving problems such as light inconsistency and light spots and improving the optical performance of the LED device.

In one embodiment, a middle portion of the bottom 32 of the transparent accommodating layer 30 is convex, for example, the bottom 32 of the transparent accommodating layer 30 comprises a first bottom portion 321, a second bottom portion 323, and a middle bottom portion 322 between the first and second bottom portions 321, 323. The depth of the first bottom portion 321 to the top surface of the transparent accommodating layer 30 equals to that of the second bottom portion 323 to the top surface of the transparent accommodating layer 30. The depth of the first bottom portion 321 to the top surface of the transparent accommodating layer 30 is no less than that of the middle bottom portion 322 to the top surface of the transparent accommodating layer 30. In this way, low light purity cause by different optical paths of lights in different directions in the phosphor layer 40 can be avoided.

In this embodiment, the phosphor layer on the middle bottom portion 322 has a thickness of H. The first and second bottom portions 321, 323 have the same width of L. The shape and the thickness of the middle bottom portion 322 can be adjusted according to practical use. As shown in FIG. 6c, a light o1 is a light emitted vertically upwards from the centre of the light emitting surface of the LED epitaxial layer 20, and a light o2 is a light emitted obliquely leftwards from the light emitting surface of the LED epitaxial layer 20. An optical path difference between the light o1 and the light o2 in the phosphor layer 40 may be much smaller than that in the prior art. In this way, lights emitted from each point of the light emitting surface of the LED wafer may have the same optical path, thus improving the consistency of main wavelengths of lights emitted from each point of the light emitting surface of the LED wafer and improving the color purity of the LED chip comprising the LED wafer. Preferably, L is within a range from 0.50 H to 0.87 H.

In one embodiment, the transparent accommodating layer 30 may have a side wall but no bottom. Then, a recess can be formed between the light emitting surface of the LED epitaxial layer 20 and the protective layer 60. A middle layer can be deposited on the middle of the light emitting surface of the LED epitaxial layer 20 to form a middle bottom portion as described above. The middle layer can be a layer of a material, which is the same as that of the transparent accommodating layer 30.

In one embodiment, the transparent accommodating layer 30 can be omitted, and the phosphor layer 30 is directly formed on the light emitting surface of the vertical flip LED wafer 80.

In one embodiment, if a good electrical connection between the transparent accommodating layer 30 and the N-type GaN semiconductor layer is formed, the first electrode 70 is directly formed on the side wall 31 of the transparent accommodating layer 30, thus forming an electrical connection between the first electrode 70 and the N-type GaN semiconductor layer.

In another embodiment, if a good electrical connection between the transparent accommodating layer 30 and the N-type GaN semiconductor layer is not formed, an opening may be formed in the side wall 31 of the transparent accommodating layer 30 and pass through the bottom 32 of the transparent accommodating layer 30 to expose a portion of the N-type GaN semiconductor layer, and then the first electrode 70 is deposited in the opening and directly formed on the N-type GaN semiconductor layer, thus forming an electrical connection between the first electrode 70 and the N-type GaN semiconductor layer.

In a further embodiment, the top surface of the N-type GaN semiconductor layer (i.e., the light emitting surface of the LED epitaxial layer 20) is divided into an electrode area and a transparent accommodating layer area. In the following steps, the transparent accommodating layer 30 is formed on the transparent accommodating layer area, and the first electrode 70 is deposited on the electrode area.

The protective layer 60 may be a silicon dioxide layer or a transparent metal oxide layer, preferably, a silicon dioxide layer. The area of the surface of the protective layer 60 is equal to or greater than the area of the top surface of the recess in the transparent accommodating layer 30, in order to form a closed space between the protective layer 60 and the transparent accommodating layer 30. The phosphor layer 40 is closed in the closed space, thus preventing the phosphor layer 40 from reacting with other outside materials. Optionally, the protective layer 60 is directly connected with the phosphor layer 40 and filled in the recess to enhance the light emitting efficiency. In one embodiment, the protective layer 60 can be omitted.

The LED device according to an embodiment of the present disclosure comprises a phosphor layer with a controllable thickness and a flat surface, and consequently exhibits good optical performance. The LED device may emit white light directly, thus simplifying the subsequent packaging steps.

Embodiment 3

Example g)

Figure 7A:
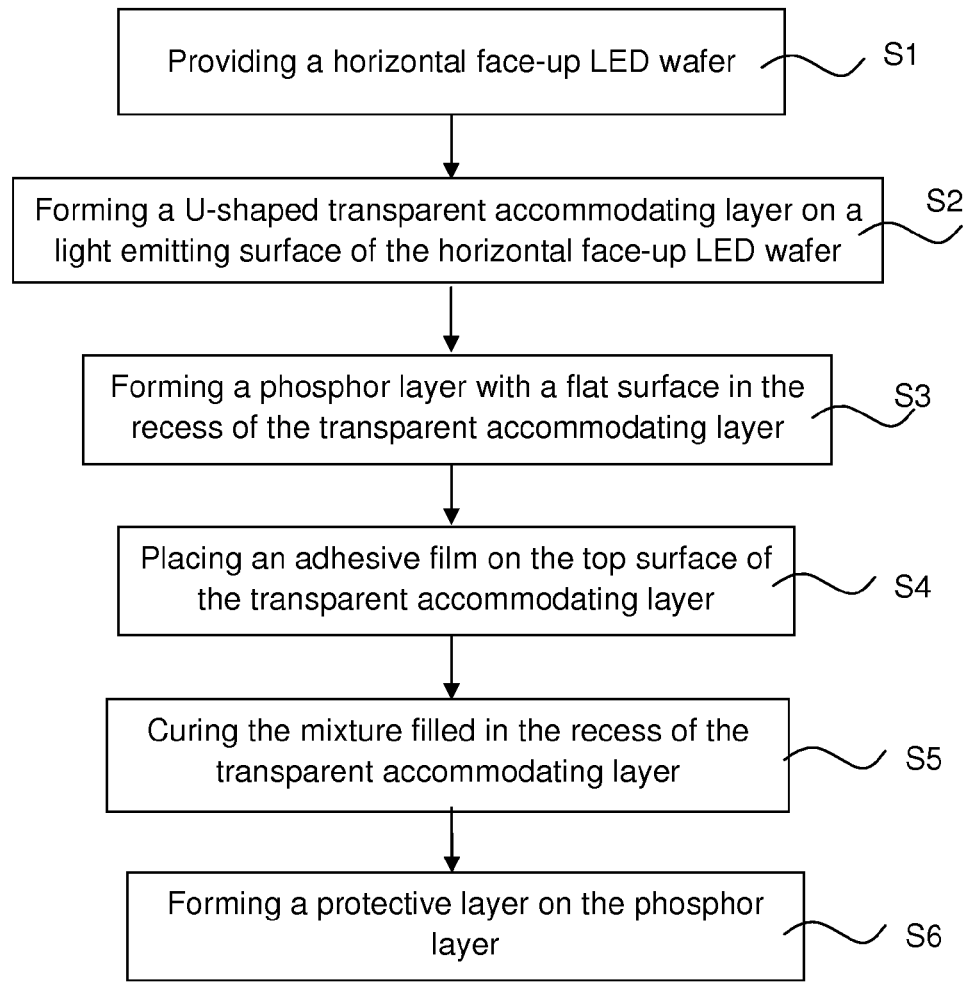
FIGS. 7a and 7b are flow charts illustrating a method for forming a phosphor layer on an LED wafer according to an embodiment of the present disclosure.

As shown in FIG. 7a, a flow chart of a method for forming a horizontal face-up LED wafer with a phosphor layer is shown. The method comprises the following steps.

S1: a horizontal face-up LED wafer is provided. In some embodiments, the horizontal face-up LED wafer comprises an LED unit; the LED unit comprises a sapphire substrate and an LED epitaxial layer formed on the sapphire substrate; and the LED epitaxial layer comprises an N-type GaN semiconductor layer formed on the sapphire substrate, an InGaN multiple quantum well layer formed on the N-type GaN semiconductor layer, and a P-type GaN semiconductor layer formed on the InGaN multiple quantum well layer. In other embodiments, the horizontal face-up LED wafer comprises a plurality of LED units, and each LED unit comprises a sapphire substrate and an LED epitaxial layer formed on the sapphire substrate. The plurality of LED units may be formed in the following steps. A plurality of cross lines are formed in the top surface of the LED wafer by masking or photoetching, and the plurality of LED units are defined by the cross lines. Optionally, when cross lines are formed, etching is performed to form a step structure and expose a portion of the N-type GaN semiconductor layer. The top surface of the P-type GaN semiconductor layer is the light emitting surface of the horizontal face-up LED wafer.

S2: A transparent accommodating layer with a recess is formed on the light emitting surface of the horizontal face-up LED wafer by a deposition method, a sol gel method, or a coating method, preferably, a deposition method. The transparent accommodating layer is formed in the following steps. A flat transparent accommodating layer is formed on the light emitting surface of the horizontal face-up LED wafer, and then a portion of the transparent accommodating layer is removed to form a recess in the transparent accommodating layer, thus forming a U-shaped transparent accommodating layer. The removal of a portion of the transparent accommodating layer can be performed by etching, and the shape of the recess can be adjusted by controlling the shape of the mask and the etching time. The shape of the recess is adjusted according to practical use. The transparent accommodating layer comprises a bottom and a side wall. Preferably, the bottom comprises a central bottom portion and a lateral bottom portion, with the depth of the central bottom portion to the top surface of the recess smaller than that of the lateral bottom portion to the top surface of the recess. The thickness of the phosphor layer can be adjusted by the height of the side wall. In this way, the shape and the thickness of the phosphor layer can be controlled by the transparent accommodating layer, and the phosphor layer can be sealed in the recess, thus preventing the phosphor layer from reacting with outside materials. Optionally, the transparent accommodating layer can be omitted.

For a horizontal flip LED wafer comprising a transparent substrate, for example, a sapphire substrate, the transparent accommodating layer is formed by a method comprising the steps of: removing a portion of the transparent substrate by mechanical grinding and/or chemical corrosion, and etching a portion of the transparent substrate to form a recess in the transparent substrate.

S3: A phosphor layer with a flat surface is formed in the recess of the transparent accommodating layer by centrifugal spin coating. The centrifugal spin coating may favor the adjustment of the thickness of the phosphor layer and the flatness of the surface of the phosphor layer, thus solving problems such as light inconsistency or light spots in the prior art. Further, the centrifugal spin coating is performed with a spin coater. According to this embodiment, the application of the spin coater may form a phosphor layer with a flat surface, and the thickness of the phosphor layer may be adjusted by controlling the amount of the fluorescent substance and the rotation speed of the spin coater. The thickness of the phosphor layer may be adjusted to the nanometer level, and the method for controlling the thickness of the phosphor layer is much more precise than the method for controlling the thickness of the phosphor layer in the prior art. The spin coater is commonly used in the art, and consequently the application of the spin coater may not cause the cost to increase compared with the conventional method. Particularly, the step S3 is as follows. A mixture of a fluorescent substance and an adhesive is dispensed on the transparent accommodating layer on the LED wafer, and then the LED wafer is placed in a spin coater. The amount of the mixture of the fluorescent substance and the adhesive can be adjusted according to practical use. Preferably, the mixture is evenly placed on the light emitting surface of the LED wafer. Then, the spin coater is started, and a phosphor layer is coated on the light emitting surface of the LED wafer. Preferably, the thickness of the phosphor layer is no more than the depth of the recess. This may favor the subsequent deposition steps and prevent the phosphor layer from reacting with materials outside the recess.

S4: Extra mixture of the fluorescent substance and the adhesive flowing outside the recess is removed with an adhesive film, for example, an adhesive film is placed on the top surface of the transparent accommodating layer except the top surface of the recess. Then, the adhesive film is removed to remove the phosphor layer formed on the top surface of the side wall. In some embodiments, the removal step can be omitted.

S5: The mixture filled in the recess of the transparent accommodating layer is cured to form a phosphor layer.

S6: A protective layer is formed on the phosphor layer by vapor deposition, thus sealing the phosphor layer in the recess. The protective layer is a silicon dioxide layer or a transparent metal oxide layer.

The method of forming a phosphor layer on the LED wafer can be performed on one or more LED wafers at the same time, which improves the production efficiencies of the LED device.

Example h)

Figure 7B:
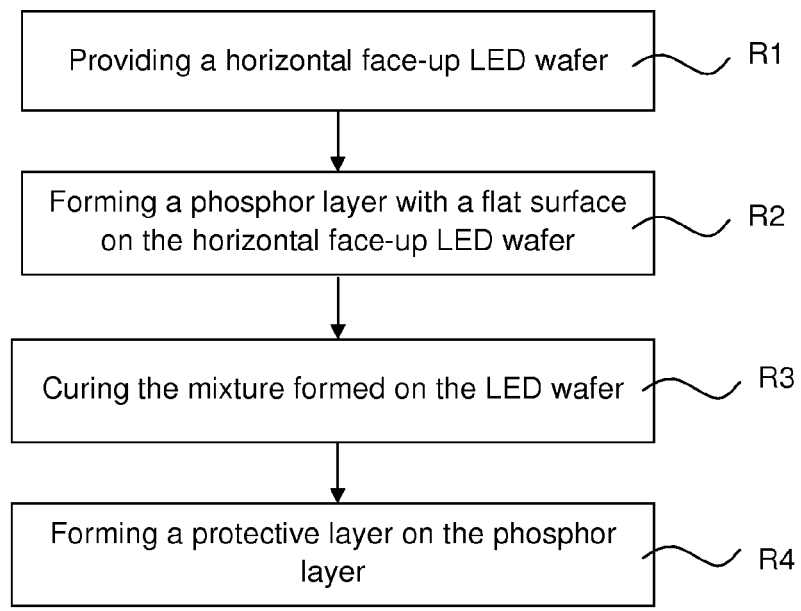

As shown in FIG. 7b, a flow chart of a method for forming a horizontal face-up LED wafer with a phosphor layer is shown. The method comprises the following steps.

R1: a horizontal face-up LED wafer is provided. In some embodiments, the horizontal face-up LED wafer comprises an LED unit; the LED unit comprises a sapphire substrate and an LED epitaxial layer formed on the sapphire substrate; and the LED epitaxial layer comprises an N-type GaN semiconductor layer formed on the sapphire substrate, an InGaN multiple quantum well layer formed on the N-type GaN semiconductor layer, and a P-type GaN semiconductor layer formed on the InGaN multiple quantum well layer. In other embodiments, the horizontal face-up LED wafer comprises a plurality of LED units, and each LED unit comprises a sapphire substrate and an LED epitaxial layer formed on the sapphire substrate. The plurality of LED units may be formed in the following steps. A plurality of cross lines are formed in the top surface of the LED wafer by masking or photoetching, and the plurality of LED units are defined by the cross lines. Optionally, when cross lines are formed, etching is performed to form a step structure and expose a portion of the N-type GaN semiconductor layer. The top surface of the P-type GaN semiconductor layer is the light emitting surface of the horizontal face-up LED wafer.

R2: A phosphor layer with a flat surface is formed on the horizontal face-up LED wafer by centrifugal spin coating. The centrifugal spin coating may favor the adjustment of the thickness of the phosphor layer and the flatness of the surface of the phosphor layer, thus solving problems such as light inconsistency or light spots in the prior art. Further, the centrifugal spin coating is performed with a spin coater. According to this embodiment, the application of the spin coater may form a phosphor layer with a flat surface, and the thickness of the phosphor layer may be adjusted by controlling the amount of the fluorescent substance and the rotation speed of the spin coater.

The thickness of the phosphor layer may be adjusted to the nanometer level, and the method for controlling the thickness of the phosphor layer is much more precise than the method for controlling the thickness of the phosphor layer in the prior art. The spin coater is commonly used in the art, and consequently the application of the spin coater may not cause the cost to increase compared with the conventional method. Particularly, the step R2 is as follows. A mixture of a fluorescent substance and an adhesive is dispensed on the LED wafer, and then the LED wafer is placed in a spin coater. The amount of the mixture of the fluorescent substance and the adhesive can be adjusted according to practical use. Preferably, the mixture is evenly placed on the light emitting surface of the LED wafer. Then, the spin coater is started, and a phosphor layer is coated on the light emitting surface of the LED wafer.

R3: The mixture formed on the LED wafer is cured to form a phosphor layer.

R4: A protective layer is formed on the phosphor layer by vapor deposition, thus sealing the phosphor layer in a recess. The protective layer is a silicon dioxide layer or a transparent metal oxide layer. Particularly, the step R4 is as follows. A portion of the phosphor layer on a periphery of the LED wafer is removed before the curing step, and then an inverted U-shaped protective layer is formed on the phosphor layer by masking or deposition. The protective layer comprises a top and a side wall extending from the top to the LED wafer, thus sealing the phosphor layer in a recess formed between the protective layer and the LED wafer.

Preferably, the step R4 is as follows. A silicon dioxide layer is deposited on the phosphor layer; then, a portion of the phosphor layer and a portion of the silicon dioxide layer on a periphery of each LED unit are removed by photoetching to expose the LED unit; and finally another silicon dioxide layer is deposited on the exposed area of the LED unit, thus forming an inverted U-shaped protective layer with the silicon dioxide layer formed on the phosphor layer.

According to EMBODIMENT 3, the final LED wafer may emit white light. The aforementioned method avoids the step of dispensing the mixture of the fluorescent substance and the adhesive, thus simplifying the packaging process and improving the sealing efficiency. Meanwhile, the application of the spin coater which is commonly used in the prior art may not increase the cost, thus solving problems of uncontrollable thickness and unflat surface of the phosphor layer to avoid light inconsistency and light spots.

Embodiment 4

Example i)

In some embodiments, a method for forming an LED device comprises the steps of: forming an LED wafer; forming a phosphor layer with a flat surface on the LED wafer by the aforementioned method; photoetching the LED wafer to expose an electrode area; depositing an electrode on the electrode area; and disparting the LED wafer to form a plurality of LED devices.

In the following, a method for forming a vertical flip LED device is taken as an example.

Figure 8A:
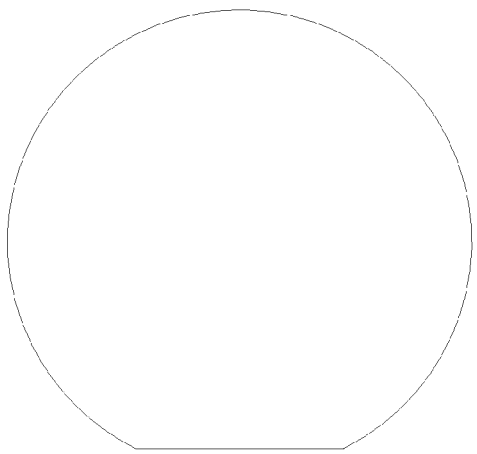
FIGS. 8a to 8j are schematic flow charts illustrating a method for forming an LED device according to an embodiment of the present disclosure.
Figure 8B:
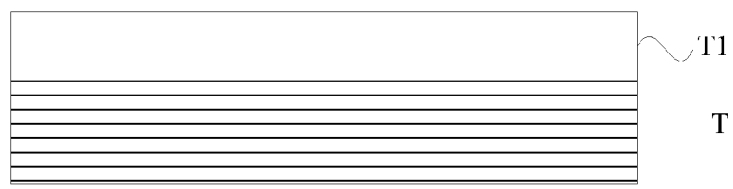
Figure 8C:
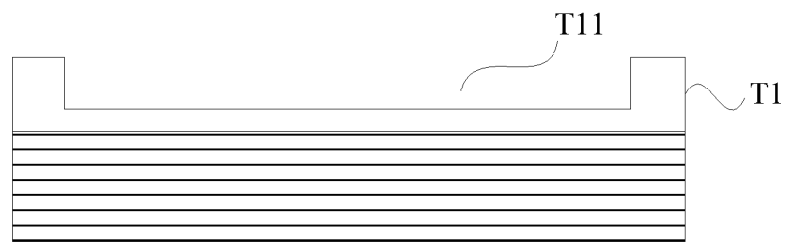
Figure 8D:
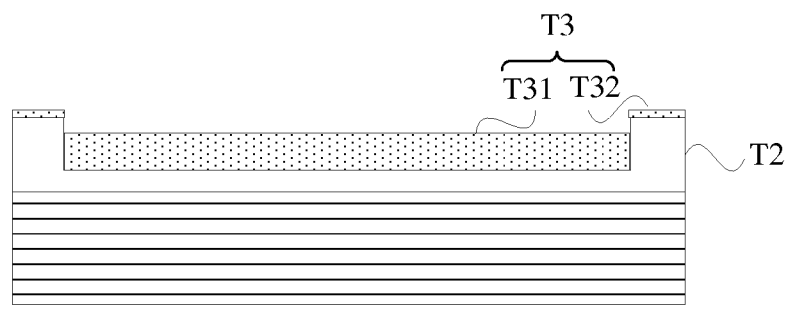
Figure 8E:
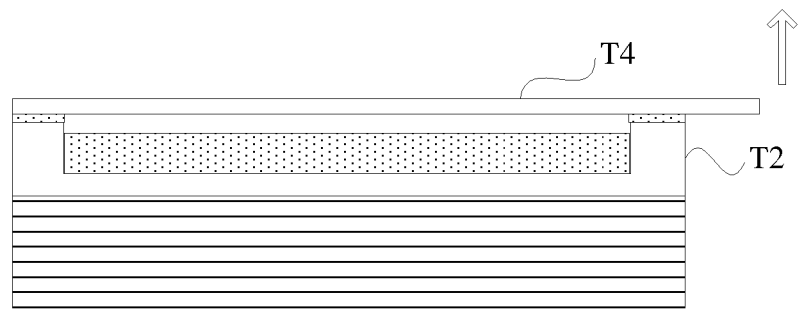
Figure 8F:
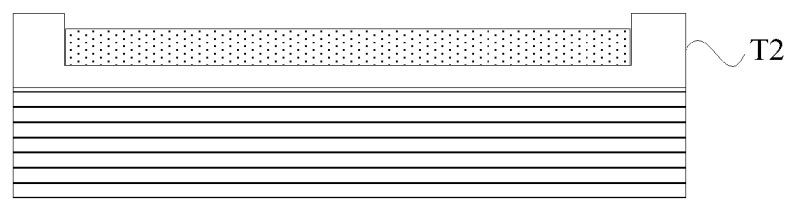
Figure 8G:
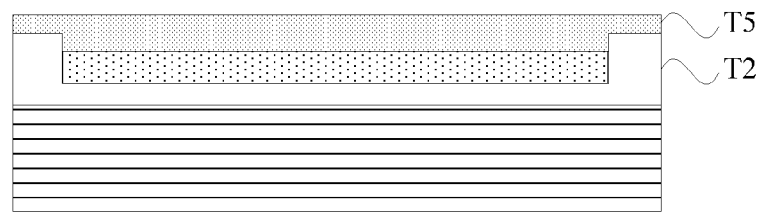
Figure 8H:
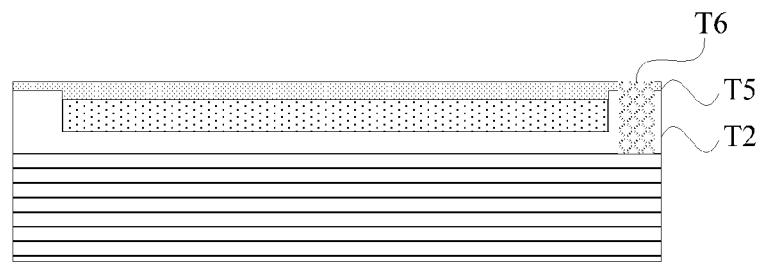
Figure 8I:
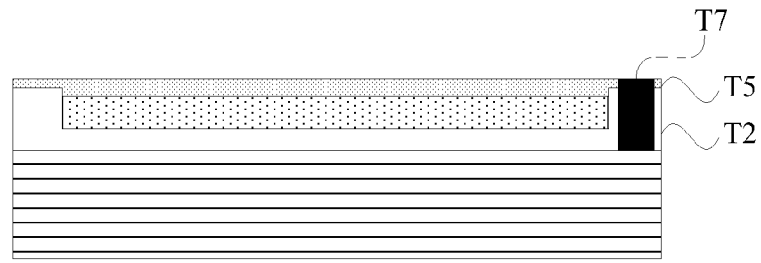
Figure 8J:
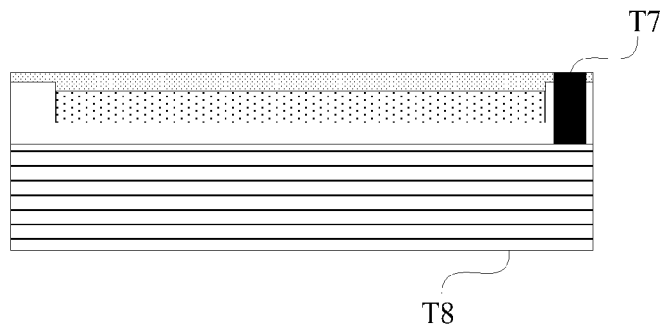

FIGS. 8a-8j show a flow chart of a method for forming the LED device. FIG. 8a is a top view of an LED wafer; FIGS. 8b-8i show each LED unit in the LED structure; and FIG. 8j is a cross-sectional view of an LED device according to an embodiment of the present disclosure.

According to the present embodiment, the LED device may have good light consistency, good heat dissipation, and good antistatic properties. The detailed steps are as follows.

In some embodiments, a vertical flip LED wafer is provided, as shown in FIG. 8a. The vertical flip LED wafer can be commercially available. In some embodiments, the vertical flip LED wafer can also be self-prepared by a method comprising the steps of: forming an epitaxial layer on a sapphire substrate by MOCVD, in which the epitaxial layer comprises an N-type GaN semiconductor layer formed on the sapphire substrate, an InGaN multiple quantum well layer formed on the N-type GaN semiconductor layer, and a P-type GaN semiconductor layer formed on the InGaN multiple quantum well layer; forming a second electrode such as a tungsten electrode or a gold electrode on the top surface of the epitaxial layer (i.e., a P-type GaN semiconductor layer) by vacuum evaporation or sputtering; providing a second substrate (i.e., a supporting substrate) with good conductivity and good heat dissipation and forming a metal layer on the second substrate by vacuum evaporation or sputtering; forming the P-type GaN semiconductor layer on the metal layer on the second substrate; grinding and then removing the sapphire substrate by laser to expose the N-type GaN semiconductor layer so as to form a vertical flip LED wafer T. In other embodiments, the sapphire substrate is grinded to reduce the thickness of the sapphire substrate, and then the sapphire substrate having a reduced thickness can be used as a transparent accommodating layer T1, thus forming a vertical flip LED wafer T, as shown in FIG. 8b.

In one embodiment, if the vertical flip LED wafer T has no transparent accommodating layer, after the sapphire substrate is removed, a transparent accommodating layer T1 is deposited on the vertical flip LED wafer T, as shown in FIG. 8b. There are no special limits on the material of the transparent accommodating layer T, provided that the material can have good light transmitting properties. Preferably, the transparent accommodating layer T1 is a silicon dioxide layer. The transparent accommodating layer T1 is etched (such as photoetched) to form a recess T11 in transparent accommodating layer T1, as shown in FIG. 8c. The recess T11 in the transparent accommodating layer T1 can be used to adjust the thickness and the shape of the phosphor layer, which is hard to solve in the prior art.

A fluorescent substance and an adhesive are mixed with a suitable proportion to form a mixture, and the mixture is dispensed on the transparent accommodating layer. The LED wafer is placed in a spin coater and then coated with a mixture layer T3 having a flat surface. The mixture layer T3 comprises a first part T31 formed in the recess of the transparent accommodating layer, and a second part T32 formed on the top surface of the side wall of the transparent accommodating layer, as shown in FIG. 8d. The thickness and the shape of the phosphor layer can be adjusted by controlling the amount of the mixture and the shape of the recess. Preferably, the thickness of the first part T31 is smaller than the height of the side wall of the transparent accommodating layer. Because the mixture of the fluorescent substance and the adhesive is viscous, some of the mixture may be formed on the side wall, thus forming the second part T32. In one embodiment, prior to the formation of the mixture layer, photoresists are formed on a portion of the top surface of the transparent accommodating layer on which the mixture may not need to be formed, and the photoresists are removed after the formation of the mixture layer.

An adhesive film T4 is applied on the second part T32, and then removed to remove the mixture formed on the side wall, as shown in FIG. 8e. As the thickness of the first part T31 in the recess is less than the height of the side wall, the second part T32 may be removed by removing the adhesive film T4, and the first part T31 in the recess is exposed, as shown in FIG. 8f.

The mixture of the fluorescent substance and the adhesive in the recess is cured to form a phosphor layer in the recess.

A protective layer T5 is formed on the transparent accommodating layer by a PEVCD (plasma-enhanced chemical vapor deposition) method. The protective layer T5 is filled in the recess and seals the phosphor layer in the recess formed between the transparent accommodating layer and the protective layer T5, as shown in FIG. 8g. The cured mixture forms a phosphor layer, and the mixture may not be subjected to any chemical treatment or react with any other material before and after the curing step. The protective layer T5 seals the phosphor layer in the recess of the transparent accommodating layer, thus preventing outside organic solvents, corrosion solutions, or other chemical materials from reacting with the phosphor layer in the subsequent steps. In this way, the light emitting efficiency may be improved.

A portion of the protective layer T5 and a portion of the transparent accommodating layer T2 are etched, thus forming an opening T6 therein and exposing a part of the N-type semiconductor layer on which an electrode will be deposited. In one embodiment, if the transparent accommodating layer is a transparent layer such as a metal layer, a portion of the protective layer is removed to form an opening and expose an electrode area on the transparent accommodating layer. In another embodiment, if the electrode area is pre-defined before the protective layer is deposited, a portion of the protective layer may be deposited on the electrode area, and then all or part of the protective layer deposited on the electrode area is removed to expose the electrode area.

The first electrode T7 is deposited on the electrode area. The first electrode T7 passes through the protective layer T5 and the transparent accommodating layer T2, and is electrically connected with the N-type semiconductor layer, as shown in FIG. 8i.

The wafer prepared in the above steps is separated to form a plurality of LED devices as shown in FIG. 8j. A cathode and an anode of a battery are connected to a second electrode T8 and the first electrode T7 respectively, and the LED devices according to this embodiment may emit white lights.

According to an embodiment of the present disclosure, a phosphor layer is formed by centrifugal spin coating so that the phosphor layer may have a flat surface, thus simplifying the subsequent steps in the LED packaging process. According to an embodiment of the present disclosure, because the LED device has a phosphor layer with a controllable thickness and a flat surface, the LED device has good optical performance.

Although explanatory embodiments have been shown and described, it would be appreciated by those skilled in the art that changes, alternatives, and modifications all falling into the scope of the claims and their equivalents may be made in the embodiments without departing from spirit and principles of the disclosure. The changes, alternatives, and modifications all fall into the scope of the claims and their equivalents.

What is claimed is:

1. An LED structure, comprising:
   an LED wafer;
   a transparent accommodating layer directly formed on a light emitting surface of the LED wafer, wherein the transparent accommodating layer is conductive and has a recess; and
   a phosphor layer having a flat surface and formed in recess of the transparent accommodating layer, wherein the phosphor layer is formed by centrifugal spin coating.

2. The LED structure according to claim 1, further comprising:
   a protective layer formed above the phosphor layer, wherein the protective layer is a silicon dioxide layer or a transparent metal oxide layer.

3. The LED structure according to claim 1, wherein the transparent accommodating layer comprises:
   a bottom; and
   a side wall surrounding the bottom,
   in which the side wall and the bottom define the recess.

4. The LED structure according to claim 3, wherein a middle portion of the bottom of the transparent accommodating layer is convex, the bottom of the transparent accommodating layer comprises a first bottom portion, a second bottom portion, and a middle bottom portion between the first and second bottom portions, in which a depth of the first bottom portion to a top surface of the recess equals to that of the second bottom portion to the top surface of the recess, and the depth of the first bottom portion to the top surface of the recess is no less than that of the middle bottom portion to the top surface of the recess.

5. A method for forming an LED structure, comprising steps of:
   providing an LED wafer;
   forming a transparent accommodating layer having a recess directly on the light emitting surface of the LED wafer, wherein the transparent accommodating layer is conductive;
   forming a mixture of a fluorescent substance and an adhesive in the recess by centrifugal spin coating; and
   curing the mixture of the fluorescent substance and the adhesive to form a phosphor layer having a flat surface.

6. The method according to claim 5, further comprising:
   forming a protective layer above the phosphor layer, wherein the protective layer is a silicon dioxide layer or a transparent metal oxide layer.

7. The method according to claim 5, further comprising:
   removing extra mixture of the fluorescent substance and the adhesive flowing outside the recess with an adhesive film.

8. The method according to claim 5, wherein the transparent accommodating layer comprises:
   a bottom; and
   a side wall surrounding the bottom,
   in which the side wall and the bottom define the recess.

9. The method according to claim 8, wherein the step of forming the transparent accommodating layer comprises:
   forming a transparent material layer on the light emitting surface of the LED wafer; and
   etching the transparent material layer to form the recess.

10. The method according to claim 8, wherein a middle portion of the bottom of the transparent material layer is convex.

11. The method according to claim 10, wherein the bottom of the transparent accommodating layer comprises a first bottom portion, a second bottom portion, and a middle bottom portion between the first and second bottom portions, in which a depth of the first bottom portion to a top surface of the recess equals to that of the second bottom portion to the top surface of the recess, and the depth of the first bottom portion to the top surface of the recess is no less than that of the middle bottom portion to the top surface of the recess.

12. The method according to claim 5, wherein the centrifugal spin coating is performed with a spin coater.

13. An LED device, comprising:
   a substrate;
   an LED epitaxial layer comprising a first semiconductor layer, an active layer and a second semiconductor layer formed sequentially on the substrate;
   a first electrode electrically connected to the first semiconductor layer;
   a second electrode electrically connected to the second semiconductor layer;
   a transparent accommodating layer directly formed on the LED epitaxial layer, wherein the transparent accommodating layer is conductive and has a recess; and
   a phosphor layer having a flat surface formed in the recess, wherein the phosphor layer is formed by centrifugal spin coating.

14. The LED device according to claim 13, wherein the transparent accommodating layer comprises:
   a bottom; and
   a side wall surrounding the bottom, in which the side wall and the bottom define the recess.

15. The LED device according to claim 14, wherein the bottom of the transparent accommodating layer comprises a first bottom portion, a second bottom portion, and a middle bottom portion between the first and second bottom portions, in which a depth of the first bottom portion to a top surface of the recess equals to that of the second bottom portion to the top surface of the recess, and the depth of the first bottom portion to the top surface of the recess is no less than that of the middle bottom portion to the top surface of the recess.

16. The LED device according to claim 13, wherein the LED device is a horizontal face-up LED device, a horizontal flip LED device, a vertical face-up LED device, or a vertical flip LED device.

17. A method for forming an LED device, comprising steps of:
   providing an LED wafer;
   forming a phosphor layer having a flat surface above a light emitting surface of the LED wafer by a method according to claim 8;

photoetching a surface of the LED wafer to expose an electrode area;
depositing an electrode in the electrode area; and
disparting the LED wafer to form a plurality of LED devices.

\* \* \* \* \*